(12) United States Patent
Park et al.

(10) Patent No.: US 10,033,327 B2
(45) Date of Patent: Jul. 24, 2018

(54) ROOF INTEGRATED PHOTOVOLTAIC MODULE WITH A DEVICE CAPABLE OF IMPROVING AND OPTIMIZING PHOTOVOLTAIC EFFICIENCY

(71) Applicant: EDISUN SOLITEC CO., LTD., Gimpo-si, Gyeonggi-do (KR)

(72) Inventors: Jong-Eon Park, Gimpo-si (KR); Dong-Sig Park, Dongducheon-si (KR); Young-Jin Kim, Goyang-si (KR); Seong-Mun Jo, Gimpo-si (KR)

(73) Assignee: EDISUN SOLITEC CO., LTD., Gimpo-si, Gyeonggi-Do (KR)

( * ) Notice: Subject to any disclaimer, the term of this patent is extended or adjusted under 35 U.S.C. 154(b) by 0 days.

(21) Appl. No.: 14/769,192

(22) PCT Filed: Feb. 4, 2015

(86) PCT No.: PCT/KR2015/001142
§ 371 (c)(1),
(2) Date: Aug. 20, 2015

(87) PCT Pub. No.: WO2015/199308
PCT Pub. Date: Dec. 30, 2015

(65) Prior Publication Data
US 2017/0099027 A1    Apr. 6, 2017

(30) Foreign Application Priority Data
Jun. 27, 2014 (KR) .................. 10-2014-0079961

(51) Int. Cl.
*H01L 31/00* (2006.01)
*H02S 20/23* (2014.01)
(Continued)

(52) U.S. Cl.
CPC ........ *H02S 20/23* (2014.12); *H01L 31/02021* (2013.01); *H02S 20/25* (2014.12);
(Continued)

(58) Field of Classification Search
CPC .......... H02S 20/23; H02S 40/36; H02S 20/25; H02S 30/10; H02S 40/30; H02S 50/00; H01L 31/02021
(Continued)

(56) References Cited

U.S. PATENT DOCUMENTS

2004/0211459 A1* 10/2004 Suenaga ........... H01L 31/02021
                                                    136/244
2012/0161526 A1    6/2012 Huang et al.
2014/0060610 A1    3/2014 Moslehi et al.

FOREIGN PATENT DOCUMENTS

EP    2 693 289        2/2014
KR    10-1160126       6/2012
(Continued)

OTHER PUBLICATIONS

English machine translation of KR 10-1235720. (Year: 2017).*
(Continued)

*Primary Examiner* — Angelo Trivisonno
(74) *Attorney, Agent, or Firm* — Kile Park Reed & Houtteman PLLC

(57) ABSTRACT

The present invention relates to a roof integrated sunlight generation module having a device capable of improving and optimizing sunlight generation efficiency, and a sunlight generation module according to an embodiment includes a solar battery module generating electric power by using sunlight, an external frame having a receiving part receiving the solar battery module, a support frame disposed in the receiving part to support the solar battery module, the support frame having a penetration part formed at a center
(Continued)

region, and a generating efficiency optimization device installed in the penetration part and connected to an output terminal of the solar battery module to optimize efficiency of sunlight generation. Through installing the generation efficiency optimization device capable of controlling each solar battery at each solar battery, total generation efficiency of the sunlight generation system can be maximized. Through installing the generating efficiency optimization device inside of the frame, the sunlight generation module can be compactified without increasing thickness, and the sunlight generation module can be integrally formed with a roof to make installation easy, and the heats generated by the solar battery module can be dissipated easily to improve efficiency of the solar battery module.

16 Claims, 19 Drawing Sheets

(51) Int. Cl.
*H02S 50/00* (2014.01)
*H02S 30/10* (2014.01)
*H02S 40/30* (2014.01)
*H01L 31/02* (2006.01)
*H02S 20/25* (2014.01)
*H02S 40/36* (2014.01)
*H02S 40/42* (2014.01)

(52) U.S. Cl.
CPC .............. *H02S 30/10* (2014.12); *H02S 40/30* (2014.12); *H02S 40/36* (2014.12); *H02S 40/42* (2014.12); *H02S 50/00* (2013.01); *Y02B 10/12* (2013.01); *Y02E 10/50* (2013.01)

(58) Field of Classification Search
USPC .......................................................... 136/256
See application file for complete search history.

(56) References Cited

FOREIGN PATENT DOCUMENTS

| KR | 10-1235720 | | 2/2013 |
| KR | 101235720 B1 | * | 2/2013 |
| KR | 10-1383033 | | 4/2014 |
| KR | 101383033 B1 | * | 4/2014 |

OTHER PUBLICATIONS

English machine translation of KR 10-1383033. (Year: 2017).*
English translation of the Written Opinion of International Application No. PCT/KR2015/001142, dated Dec. 27, 2016.

* cited by examiner

ROOF INTEGRATED PHOTOVOLTAIC MODULE WITH A DEVICE CAPABLE OF IMPROVING AND OPTIMIZING PHOTOVOLTAIC EFFICIENCY

TECHNICAL FIELD

The present invention relates to a roof integrated photovoltaic module, and more particularly to a roof integrated photovoltaic module having a device capable of improving and optimizing photovoltaic efficiency through electric power optimization between solar battery modules and compensation of electricity generation loss caused by shadow.

BACKGROUND ART

In general, a photovoltaic system has merits such as cleanliness and inexhaustibility so that many countries have performed research for the photovoltaic system for a global environmental problem and a measure for energy diversification as a part of development of alternative energies.

In general, according to the photovoltaic system capable of producing energy by using sunlight, a plurality of photovoltaic modules are connected in serial-parallel connection to be connected to a power conversion device. That is, only one photovoltaic module has so low output voltage. Therefore, a plurality of photovoltaic module is connected in series to boost an output voltage, and a plurality of serial connection arrays are connected in parallel to get final power.

However, the photovoltaic module generates heats when producing electric power by using solar energy, and the heats deteriorates electric power generation capability. Therefore, effective heat dissipation is necessary in order to improve efficiency of the photovoltaic system.

Additionally, extra support structures are required in order to install the photovoltaic module at a roof of a house, etc., and the extra support structures are required even to a new-built house. Therefore, a structure of the house and aesthetic features of city are damaged.

Additionally, when the photovoltaic module is installed at a region with limited area such as a region with concentrated buildings and houses, there may be output power deviation between the photovoltaic modules due to a shadow of a building, a housing, a tree, etc., a shadow induced by sun angle, and various contaminant such as fallen leaves. When the photovoltaic modules with deviation are connected in series, final output power is lowered.

DETAILED DESCRIPTION OF THE INVENTION

Objects of the Invention

Therefore, the present invention considers the above problems, and provides a roof integrated photovoltaic module with a generation efficiency improving and optimizing device capable of maximizing generation efficiency of a photovoltaic system through a solution of differences among photovoltaic modules and stabilizing power by improving heat dissipation and construct ability of the photovoltaic module and separately controlling the photovoltaic module for optimizing generation efficiency of the photovoltaic module.

Technical Solution

A photovoltaic module according to an embodiment includes a solar battery module generating electric power by using sunlight, an external frame having a receiving part receiving the solar battery module, a support frame disposed in the receiving part to support the solar battery module, the support frame having a penetration part formed at a center region, and a generating efficiency optimization device installed in the penetration part and connected to an output terminal of the solar battery module to optimize efficiency of photovoltaics.

The photovoltaic module may further includes a installation rail formed to cross the penetration part for installing the generating efficiency optimization device.

The generating efficiency optimization device may include a case combined with the installation rail to be fastened, an input terminal section formed at a side face of the case, such that an output wire of the solar battery module is connected thereto, a circuit section installed inside of the case to optimize generation efficiency regarding to an input through the input terminal section, and an output section formed at a side face of the case to transmit an output of the circuit section.

The generating efficiency optimization device may further include an indication lamp indicating an normal operation state or abnormal operation state of the generating efficiency optimization device.

The generating efficiency optimization device may include a DC/DC converter section converting a level of direct current power outputted by the solar battery module, an optimization device control section controlling the DC/DC converter section to trace maximum power point of the solar battery module, and controlling an operation mode of the generating efficiency optimization device, and an operation mode converting section electrically connected with the DC/DC converter section in parallel in order to convert the operation mode of the generating efficiency optimization device according to a control of the optimization device control section.

The optimization device control section may operate the generating efficiency optimization device in a solar battery mode such that electric power outputted from the solar battery module is directly outputted without passing through the DC/DC converter section, when the solar battery module is judged to maintain an optimum operation state that is previously set. For example, the optimization device control section may maintain the operation mode converting section in an on-state, and may shut down the DC/DC converter section for the solar battery mode.

The optimization device control section may control the DC/DC converter section such that the optimization device control section maintains the operation mode converting section in an off-state to trace maximum power point, when the solar battery module is judged to be out of an optimum operation state that is previously set. For example, the optimization device control section may operate the DC/DC converter section in a buck mode when a maximum power point voltage of the solar battery module is lower than an output voltage. For another example, the optimization device control section may operate the DC/DC converter section in a boost mode when a maximum power point voltage of the solar battery module is higher than an output voltage.

The optimization device control section may further include a bypass diode for bypassing a string current, when the solar battery module is defective.

The external frame may include an upper plate and a lower plate. The lower plate may include a first lower plate protruding portion protruding out of the upper plate in a width direction and a second lower plate protruding portion protruding out of the upper plate in a length direction that is perpendicular to the width direction, and the upper plate may include a first upper plate protruding portion protruding out of the lower plate in the width direction to be opposite to the first lower plate protruding portion, and a second upper plate protruding portion protruding out of the lower plate in the length direction to be opposite to the second lower plate protruding portion.

A wiring groove for drawing a wiring out may be formed on an upper surface of the first lower plate protruding portion and a lower surface of the first upper plate protruding portion.

A combination hole may be formed on an upper surface of the first lower plate protruding portion and the second lower plate protruding portion, and a combination protrusion corresponding the combination hole may be formed on a lower surface of the first upper plate protruding portion and the second upper plate protruding portion.

The lower plate may include a first ventilation hole penetrating in the length direction of the external frame, and the support frame may include a second ventilation hole penetrating in the length direction of the external frame to be connected to the first ventilation hole.

The photovoltaic module may further include a heat dissipation plate disposed between the solar battery module and the support frame. For example, the heat dissipation plate may have a mesh shape.

A photovoltaic module according to another embodiment includes a frame with a roof tile shape, the frame having a penetration part at a center region, a solar battery module disposed on an upper surface of the frame to cover the penetration part, a generating efficiency optimization device installed in the penetration part and connected to an output terminal of the solar battery module to optimize photovoltaics, and an installation rail formed to cross the penetration part for installing the generating efficiency optimization device.

The photovoltaic module may further include a heat dissipation plate disposed on a back surface of the solar battery module.

The generating efficiency optimization device may include a DC/DC converter section converting a level of direct current power outputted by the solar battery module, an optimization device control section controlling the DC/DC converter section to trace maximum power point of the solar battery module, and controlling an operation mode of the generating efficiency optimization device, and an operation mode converting section electrically connected with the DC/DC converter section in parallel in order to convert the operation mode of the generating efficiency optimization device according to a control of the optimization device control section.

Advantageous Effects

According to the photovoltaic module described above, in order to prevent power loss induced by a shadow of a neighboring buildings, houses, trees and fallen leaves and mismatch between solar battery modules, the generation efficiency optimization device capable of controlling each solar battery is installed at each solar battery, so that the operation mode of the solar battery can be maintained in optimum state to maximize total generation efficiency of the photovoltaic system.

Further, the generating efficiency optimization device is installed inside of the frame, so that the photovoltaic module can be compactified without increasing thickness, and installation and construction can be easy.

Furthermore, the photovoltaic module according to the present invention can be integrally formed with a roof to make installation easy, and the heats generated by the solar battery module can be dissipated easily to improve efficiency of the solar battery module.

EMBODIMENTS OF THE INVENTION

The characteristics and advantageous effects will be clarified through the following figures and description. Therefore, a person skilled in the art will easily embody the idea of the present invention. The invention may have various modifications and embodiments, and the invention is described more fully hereinafter with reference to the accompanying drawings. However, The present invention should not be construed as limited to the example embodiments set forth herein, but should be understood to includes all modifications, equivalents and substitutions within the scope of the idea and technics of the present invention. The terms used in the present application are only to explain the specific embodiment and is not intended to limit the present invention. The terms "a", "an" and "the" mean "one or more" unless expressly specified otherwise. The terms "including", "comprising", etc., are to designate features, numbers, processes, structural elements, parts, and combined component of the application, and should be understood that it does not exclude one or more different features, numbers, processes, structural elements, parts, combined component. Terms such as "first", "second, etc. may be used to indicate various elements, however, the elements should not be limited by the terms. The terms are only used to distinguish one structural element from another structural element. For example, a first structural element may be named as second structural element if the right is not beyond the scope, the same applies to the second structural element that may be named as the first structural element.

Hereinafter, embodiments of the present invention will be explained referring to drawings.

Figure 1:
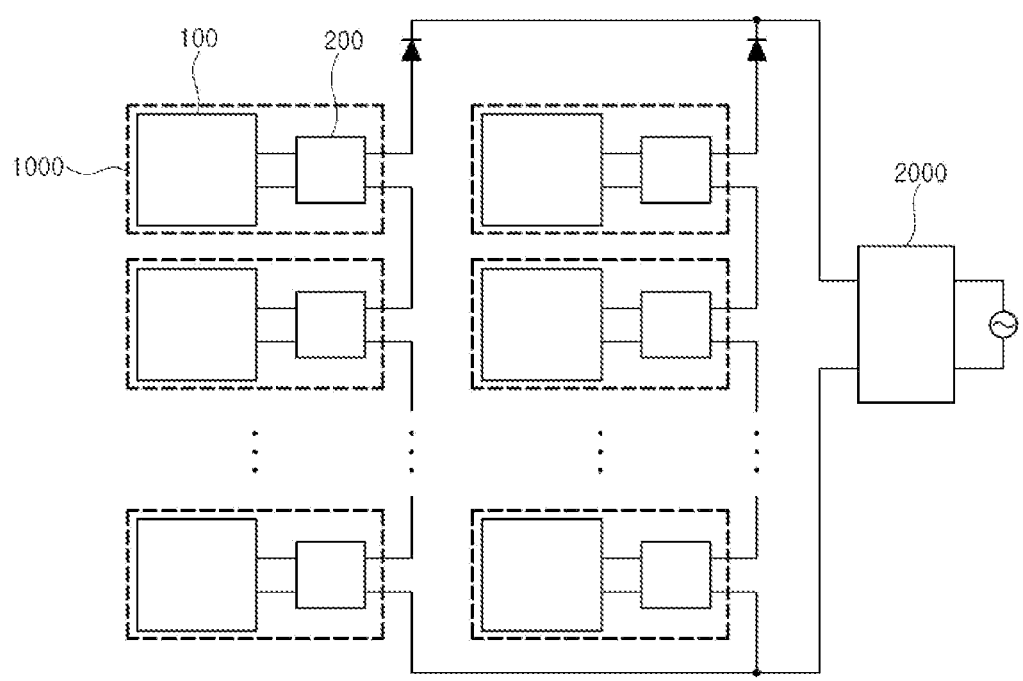
FIG. 1 is a block diagram showing a photovoltaic system according to an embodiment of the present invention.

FIG. 1 is a block diagram showing a photovoltaic system according to an embodiment of the present invention.

Referring to FIG. 1, the photovoltaic system according to an embodiment of the present invention includes a plurality of photovoltaic modules 1000 and an inverter 2000 for converting a direct current power outputted from the plurality of photovoltaic modules 1000 into an alternating current power.

The photovoltaic modules 1000 may be connected with each other in serial-parallel connection in order to boost an output voltage to a voltage required by the inverter 2000. For example, the photovoltaic modules 1000 may be formed in a tile shape on a roof of a house so that the photovoltaic modules 1000 may be a roof integrated structure performing a roof operation of a house and self-generation electricity.

Each of the photovoltaic modules 1000 includes a solar battery module 100 generating electric power by using sunlight and a generating efficiency optimization device 200 respectively connected to the solar battery module 100 for optimizing generation efficiency of the photovoltaic module 1000. For example, the generating efficiency optimization device 200 is connected to all of the solar battery modules 100 one by one. Alternatively, the generating efficiency optimization device 200 may be connected to the solar battery modules 100 one by three through five.

When the photovoltaic modules 1000 are installed at a region with concentrated buildings and houses or a region with limited area, there may be output power deviation between the photovoltaic modules 1000 due to a shadow of a building, a housing, a tree, etc., a shadow induced by sun angle, and various contaminant such as fallen leaves. When the photovoltaic modules 1000 with deviation are connected in series, final output power is lowered. Therefore, according to the present invention, the generating efficiency optimization device 200 for controlling the operation of the photovoltaic modules 1000 is connected to each of the solar battery modules 100 so that efficiency of the final output power outputted from the photovoltaic system may be improved and optimized.

Figure 2:
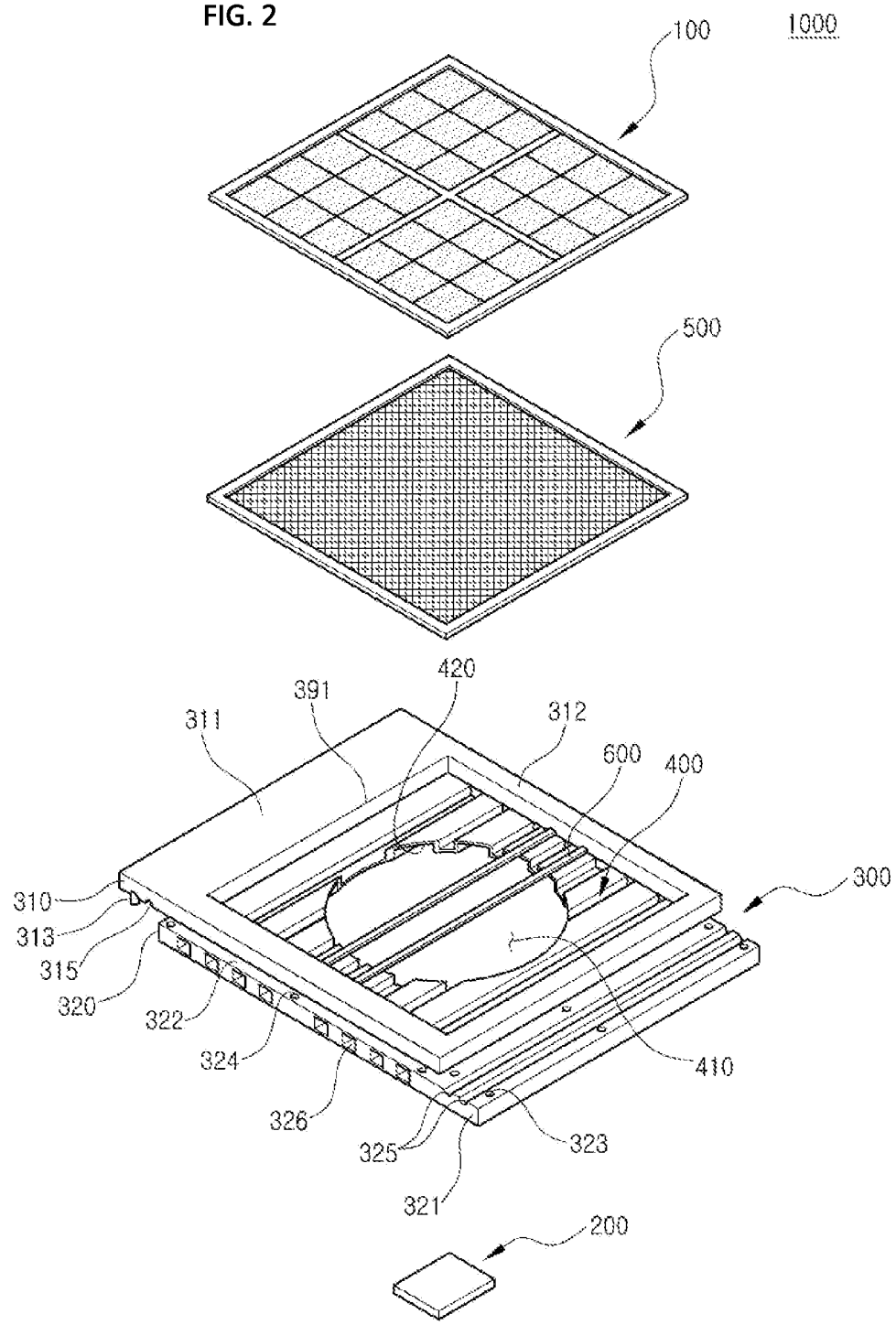
FIG. 2 is an exploded perspective view showing a photovoltaic module according to an embodiment of the present invention.
Figure 3:
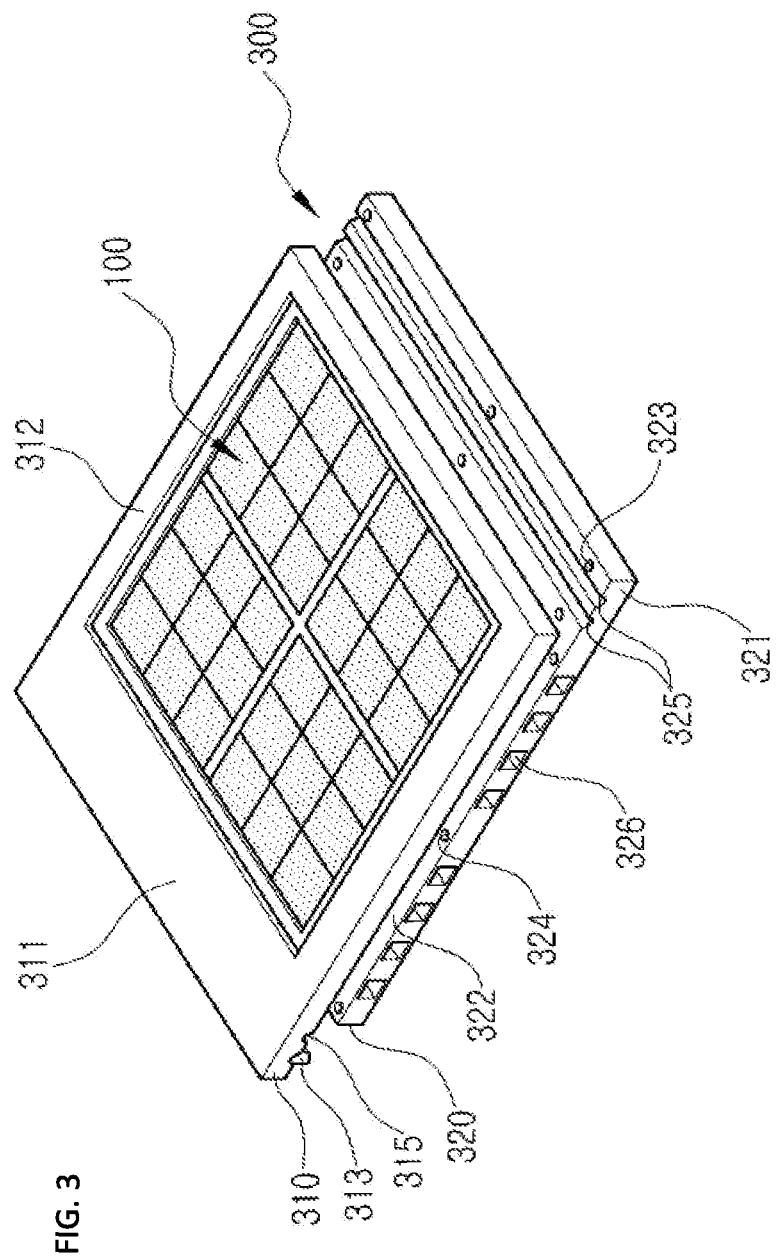
FIG. 3 is a combined perspective view showing the photovoltaic module in FIG. 2.
Figure 4:
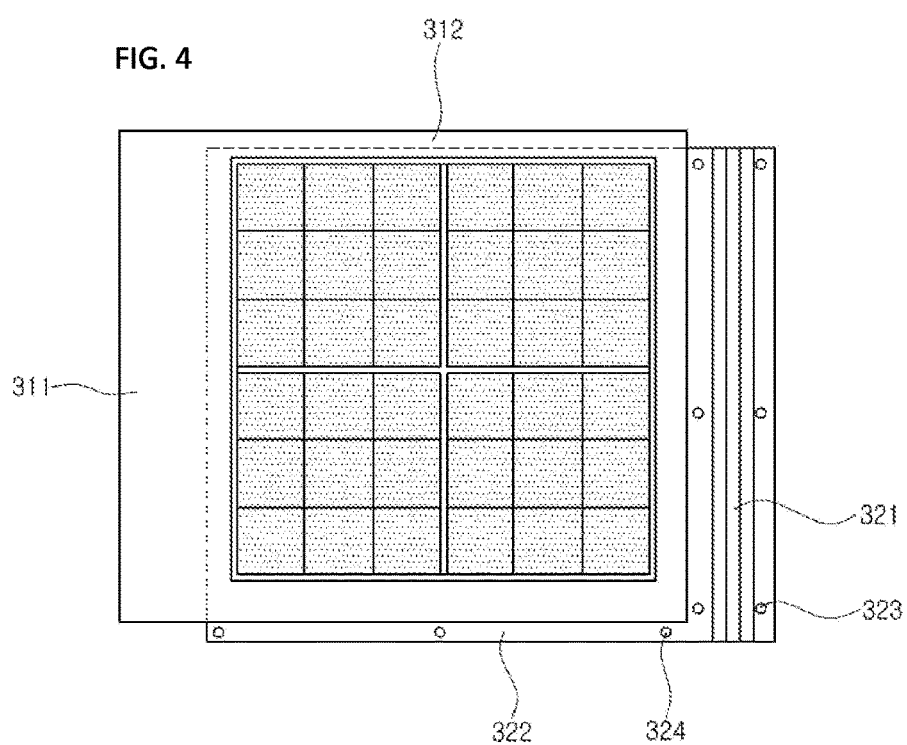
FIG. 4 is a plan view showing the photovoltaic module in FIG. 2.
Figure 5:
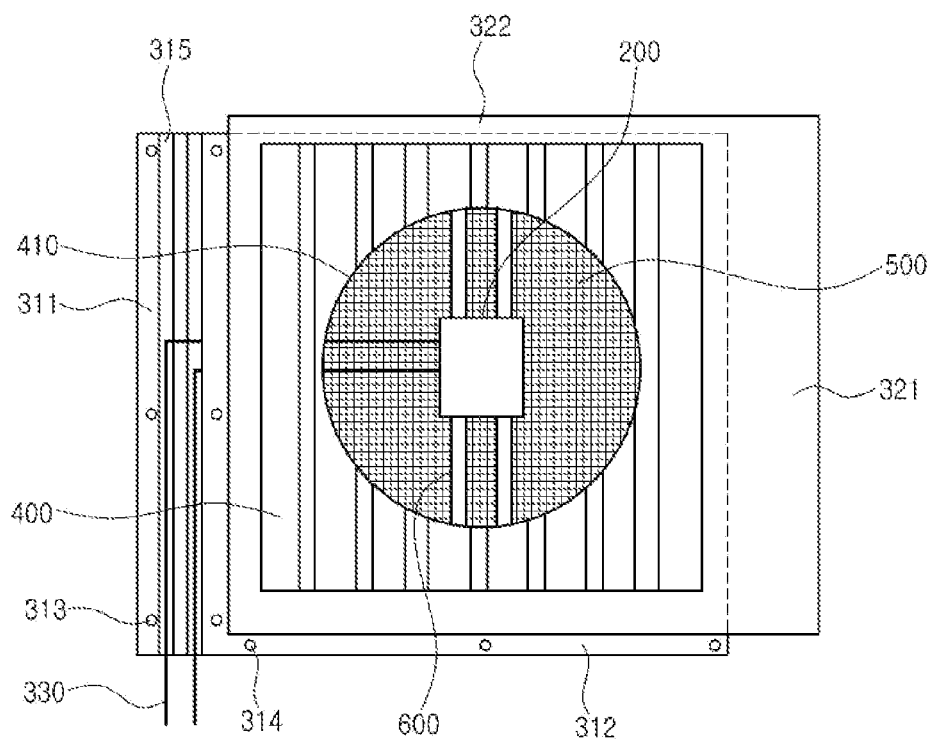
FIG. 5 is a rear view showing the photovoltaic module in FIG. 2.
Figure 6:
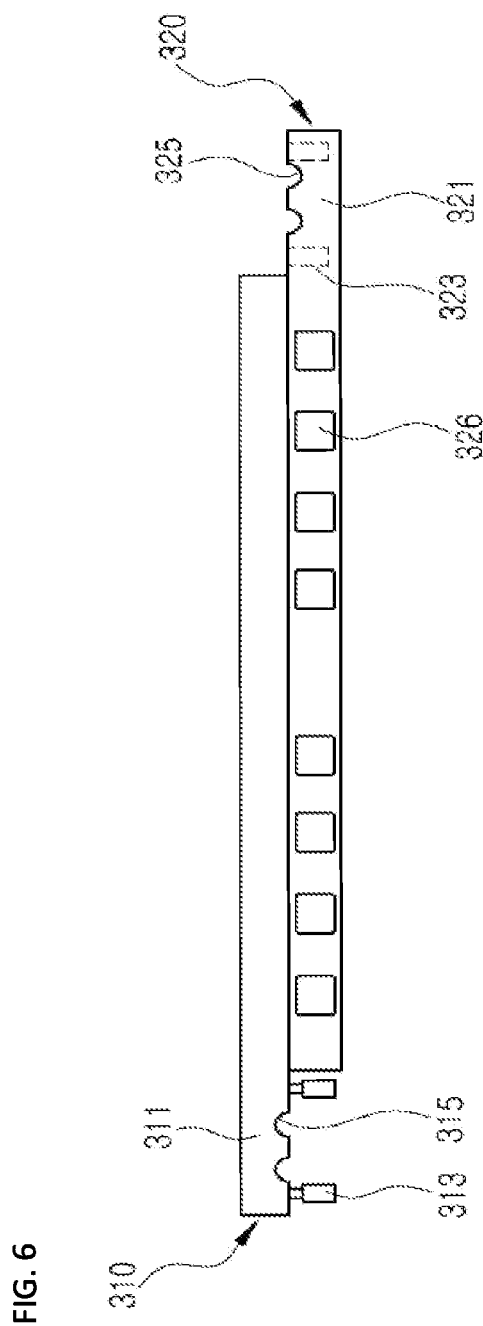
FIG. 6 is a front view showing the photovoltaic module in FIG. 2.
Figure 7:
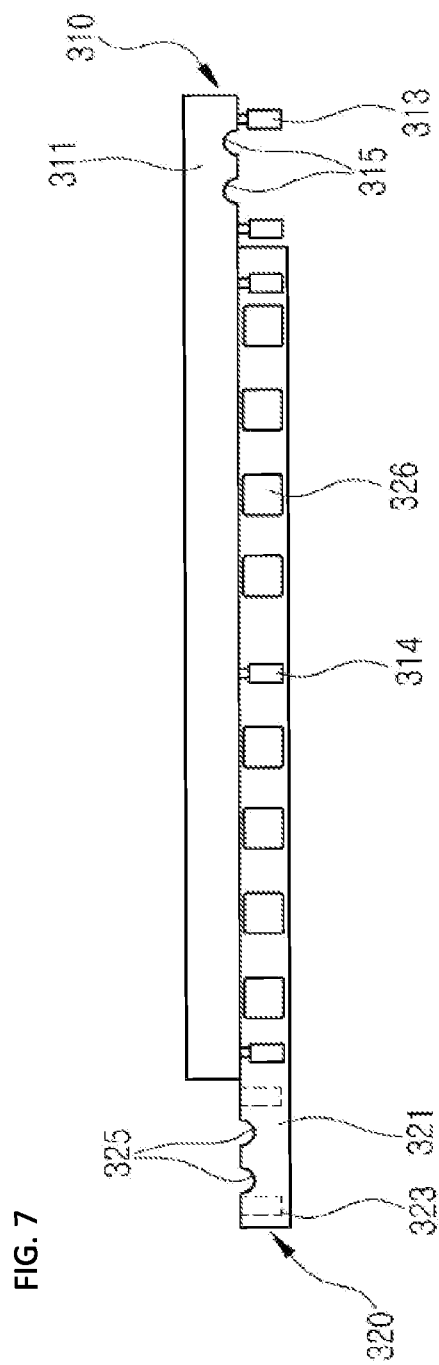
FIG. 7 is a back view showing the photovoltaic module in FIG. 2.

FIG. 2 is an exploded perspective view showing a photovoltaic module according to an embodiment of the present invention, FIG. 3 is a combined perspective view showing the photovoltaic module in FIG. 2, FIG. 4 is a plan view showing the photovoltaic module in FIG. 2, FIG. 5 is a rear view showing the photovoltaic module in FIG. 2, FIG. 6 is a front view showing the photovoltaic module in FIG. 2, and FIG. 7 is a back view showing the photovoltaic module in FIG. 2.

Referring to FIG. 2 through FIG. 7, the photovoltaic module 1000 includes a solar battery module 100, an external frame 300 having a receiving part 309 receiving the solar battery module 100, a support frame 400 being disposed in the receiving part 391 to support the solar battery module 100 and having a penetration part 410 formed at a center thereof, and a generating efficiency optimization device 200 installed at the penetration part 410.

The solar battery module 100 generates electric power by using sunlight. The solar battery module 100 is a battery receiving sunlight energy to convert electric energy, and has a structure in which solar battery cells are connected in series, parallel or series-parallel.

The external frame 300 includes an upper plate 310 and a lower plate 320. The external frame 300 has a structure in which the upper plate 310 and the lower plate 320 are stacked. The lower plate 320 is formed to be protruded in a width direction and length direction with respect to the upper plate 310, so that a plurality of external frames 300 can be connected with each other without an additional combining device.

In detail, the lower plate 320 includes a first lower plate protruding portion 321 protruding out of the upper plate 310 in a width direction (left and right direction in FIG. 4), for example, in a right direction, and a second lower plate protruding portion 322 protruding out of the upper plate 310 in a length direction that is perpendicular to the width direction (up and down direction in FIG. 4), for example, in a down direction.

Further, the upper plate 310 includes a first upper plate protruding portion 311 protruding out of the lower plate 320 in the width direction, for example, in a left direction opposite to the first lower plate protruding portion 321 in FIG. 4, and a second upper plate protruding portion 312 protruding out of the lower plate 320 in the length direction, for example, in a up direction opposite to the second lower plate protruding portion 322.

For example, the upper plate 310 and the lower plate 320 is formed by rectangular plate with same width and same length, and the upper plate 310 and the lower plate 320 are shift with respect to each other in the width direction and the length direction to be combined with each other so that the first lower plate protruding portion 321, the second lower plate protruding portion 322, the first upper plate protruding portion 311 and the second upper plate protruding portion 312 are formed.

Hereinafter, the combination of the external frames 300 is explained. In detail, the external frames 300 can be combined with each other in the up and down direction and in the left and right direction by the structure of protrusions of the upper plate 310 and the lower plate 320 but by no additional element.

The combination of the external frames 300 in the present invention may be performed by fitting through a combination hole and a combination protrusion. For example, a first combination hole 323 and a second combination hole 324 are formed on an upper surface of the first lower plate protruding portion 321 and an upper surface the second lower plate protruding portion 322, respectively, and a first combination protrusion 313 corresponding to the first combination hole 323 and a second combination protrusion 314 corresponding to the second combination hole 324 are formed on a lower surface of the first upper plate protruding portion 311 and on a lower surface of the second upper plate protruding portion 312, respectively.

For example, the first combination holes 323 are formed on the upper surface the first lower plate protruding portion 321 along two lines, and three of the first combination holes 323 are formed per line with same interval. For example, the second combination holes 324 are formed on the upper surface of the second lower plate protruding portion 322 along one line, and three of the second combination holes 324 are formed per line with same interval.

For example, the first combination protrusions 313 are formed along two lines correspondingly the first combination holes 323. For example, the second combination protrusions 314 are formed along one line correspondingly the second combination holes 324.

On the other hand, a first wiring groove 325 and a second wiring groove 315 for drawing a wiring 330 out may be formed on the upper surface of the first lower plate protruding portion 321 and the lower surface of the first upper plate protruding portion 311, respectively. The first wiring groove 325 and the second wiring groove 315 extends to both ends along the length direction of the external frame 300.

A plurality of first ventilation holes 326 penetrating the lower plate 320 along the length direction of the external frame 300 may be formed at a side of the lower plate 320. Additionally, the support frame 400 may include a second ventilation hole 420 penetrating along the length direction of the external frame 300 to be connected to the first ventilation hole 326. The second ventilation hole 420 and the first ventilation hole 326 connected with each other form an air path to dissipate heat generated by the solar battery module 100. Further, the heat generated by the solar battery module 100 may be reused by connecting the air path to outside.

On the other hand, the photovoltaic module 1000 may further include a heat dissipation plate 500 disposed between the solar battery module 100 and the support frame 400. The heat dissipation plate 500 dissipate heat of the solar battery module 100 out quickly to improve efficiency of the solar battery module 100.

The heat dissipation plate 500 may be formed in a mesh type by aluminum alloy having high conductivity as shown in FIG. 2.

Figure 8:
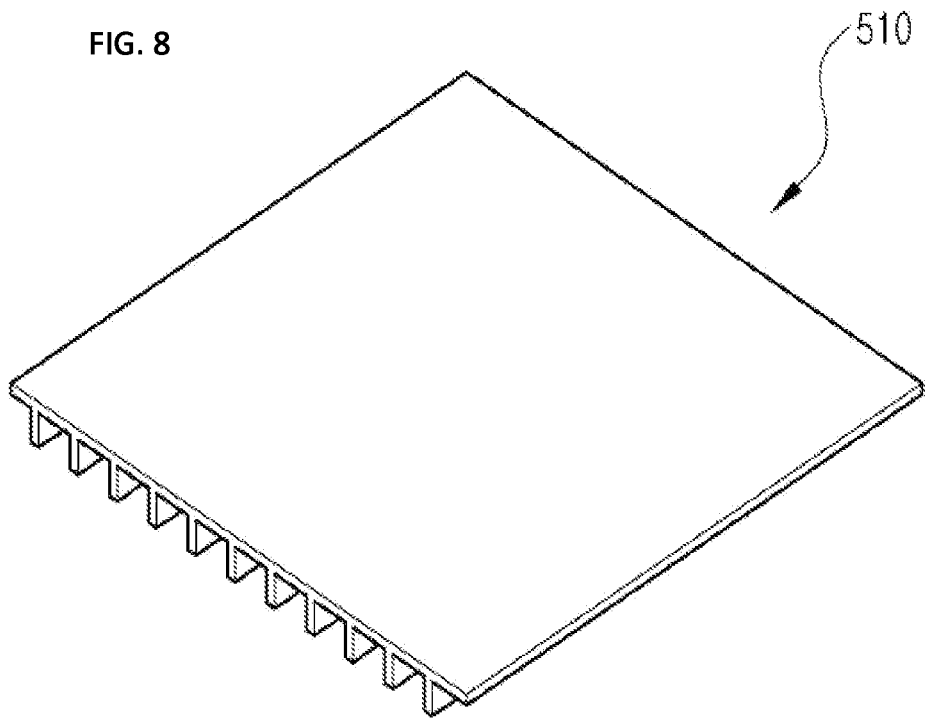
FIG. 8 and FIG. 9 are respectively a perspective view and a cross-sectional view showing a heat dissipation plate according to another embodiment.
Figure 9:
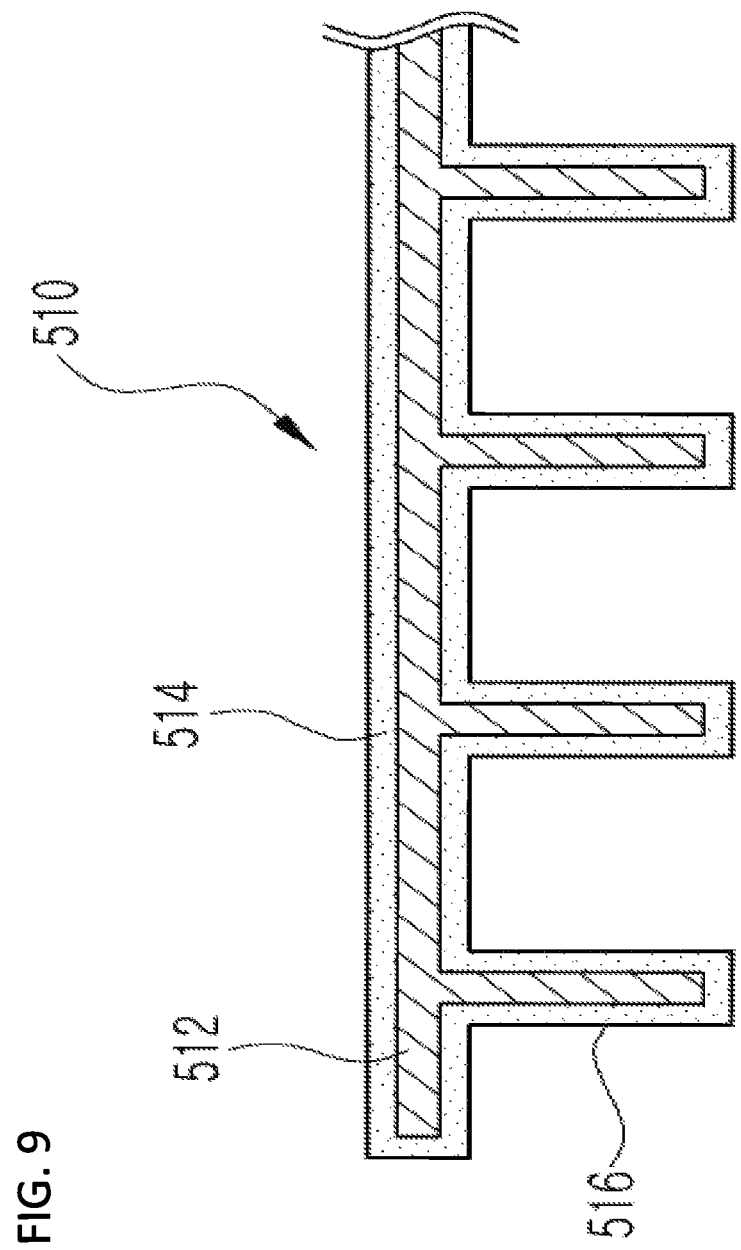

FIG. 8 and FIG. 9 are respectively a perspective view and a cross-sectional view showing a heat dissipation plate according to another embodiment.

Referring to FIG. 8 and FIG. 9, the heat dissipation plate 510 may include an low melting point metal inner plate part 512 and an aluminum outer plate part 514 covering the low melting point metal inner plate part 512. A plurality of heat dissipation fins 516 may be formed under the heat dissipation plate 510.

As described above, when the heat dissipation plate 510 has a dual structure of the aluminum outer plate part 514 and the low melting point metal inner plate part 512 formed by Hg, Na, Pb, Bi or Sn, of which melting point is lower than aluminum, the aluminum outer plate part 514 easily dissipates heats out and the low melting point metal inner plate part 512 absorbs heats during phase change from solid to liquid to prevent temperature rising. That is, when the temperature of the solar battery module 100 rises above the melting point of the low meting point metal, the low melting point metal inner plate part 512 absorbs heats while phase changing and the aluminum outer plate part 514 dissipates absorbed heat out. Therefore, the temperature of the solar battery module 100 is prevented from being rising above a specific temperature while improving the heat dissipation efficiency.

Referring again to FIG. 2 and FIG. 5, the generation efficiency optimization device 200 is installed at the penetration part 410 of the support frame 400, and is connected to an output terminal of the solar battery module 100 to improve and optimize photovoltaic efficiency.

The photovoltaic module 1000 may further include an installation rail 600 crossing the penetration part 410 for installing the generation efficiency optimization device 200. The installation rail 600 is formed between the solar battery module 100 and the support frame 400, especially, between the heat dissipation plate 500 and the support frame 400 to be exposed through the penetration part 410 for installing the generation efficiency optimization device 200. The installation rail 600 may be combined to the external frame 300 to be disposed inside of the receiving part 391 of the external frame 300. Alternatively, the installation rail 600 may be combined with the support frame 400 or integrally formed with the support frame 400.

Preferably, the installation rail 600 is formed to be space-saving in order to improve heat dissipation efficiency. In order for that, the installation rail 600 is formed in a parallel rail shape with a thin width.

Figure 10:
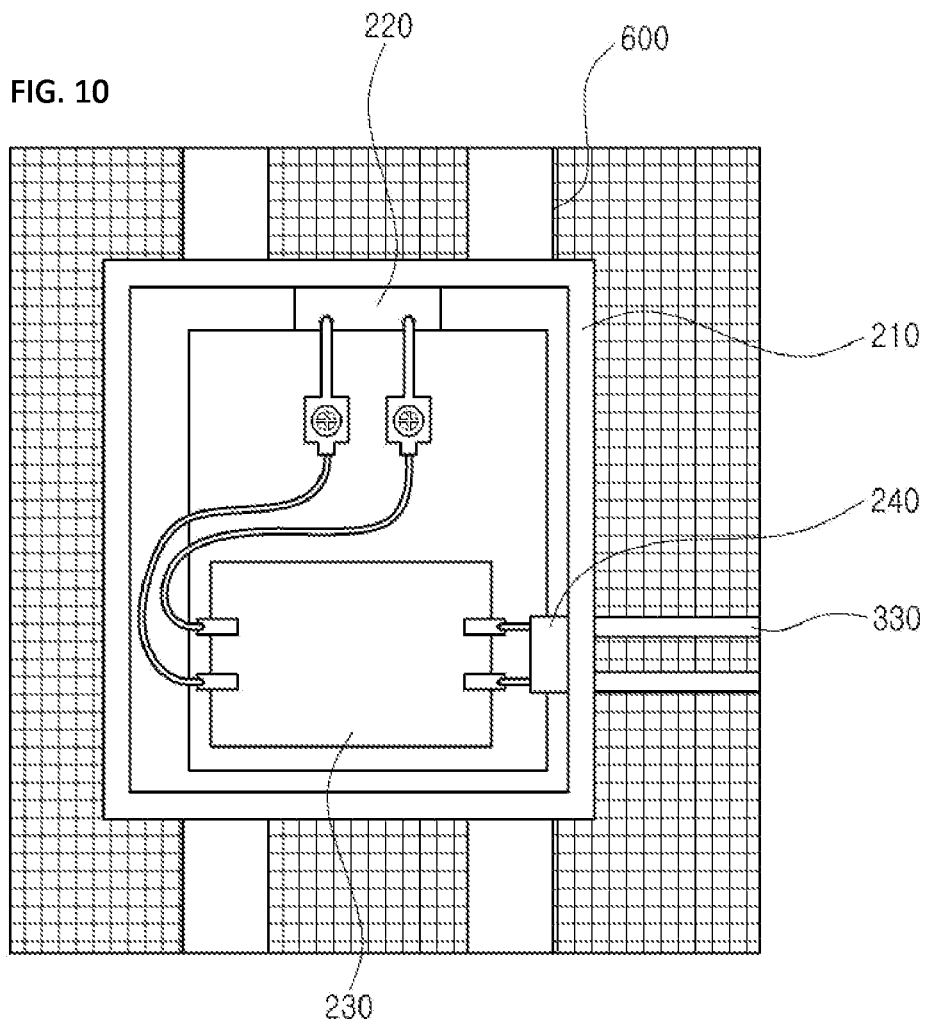
FIG. 10 is a plan view showing an installing state of a generating efficiency optimization device.
Figure 11:
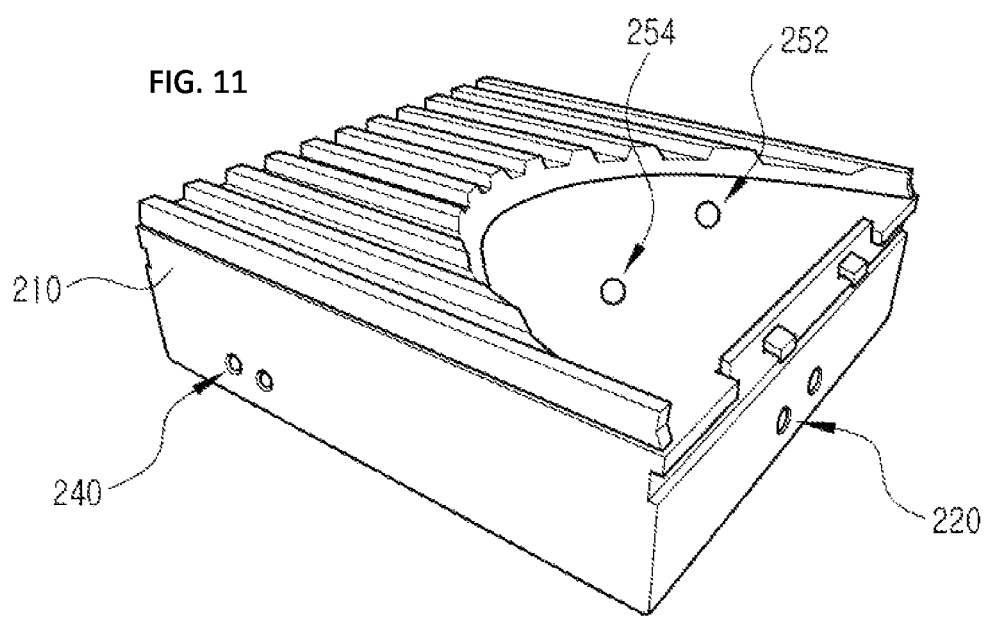
FIG. 11 is a perspective view showing the generating efficiency optimization device.

FIG. 10 is a plan view showing an installing state of a generating efficiency optimization device, and FIG. 11 is a perspective view showing the generating efficiency optimization device.

Referring to FIG. 10 and FIG. 11, the generation efficiency optimization device 200 includes a case 210 combined with the installation rail 600 to be fastened, an input terminal section 220 formed at a side face of the case 210, to which an out cable of the solar battery module 100 is connected, a circuit section 230 being installed in the case 210 and performing generation efficiency optimization with regard to an input of the input terminal section 220, and an output terminal section 240 formed at a side face of the case 210 in order to transmit an output of the circuit section 230.

The input terminal section 220 and the output terminal section 240 have a jack connection structure, so that it is convenient to be connected to the wiring 330.

The generation efficiency optimization device 200 may include a normal state indication lamp 252 and an abnormal state indication lamp 254 for indicating normal or abnormal operation state of the generation efficiency optimization device 200. Through the normal state indication lamp 252 and the abnormal state indication lamp 254, an operation of corresponding photovoltaic module 1000 can be grasped and a maintenance of the photovoltaic module 1000 can be performed.

As described above, through installing the generation efficiency optimization device 200 for optimizing generation efficiency of the photovoltaic module 1000 at the penetration part 410 of the support frame 400, the photovoltaic module 1000 can be compactified and the efficiency of installation and construction can be improved.

Figure 12:
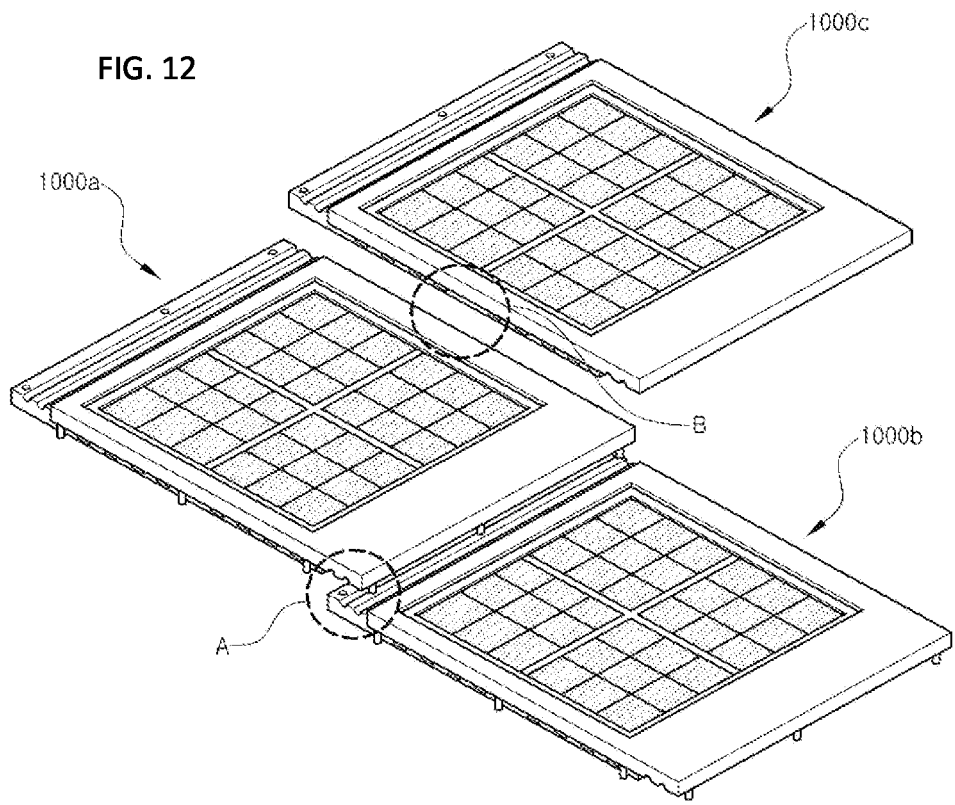
FIG. 12 is a perspective view showing photovoltaic modules according to an embodiment of the present invention, which are combined with each other.

FIG. 12 is a perspective view showing photovoltaic modules according to an embodiment of the present invention, which are combined with each other.

Referring to FIG. 12, a plurality of photovoltaic modules 1000a, 1000b and 1000c, which are identical, is combined with each other in the width direction and the length direction, so that a photovoltaic module array capable of covering various areas can be formed.

Since each of the photovoltaic modules 1000a, 1000b and 1000c is combined with neighboring photovoltaic module 1000a, 1000b and 1000c, the combination thereof is stable. The air path formed through the first ventilation holes 326 and the second ventilation holes 420 are connected, respectively, without severance when the photovoltaic modules 1000a, 1000b and 1000c are connected, so that heat dissipation and heat reuse may be effectively achieved.

Figure 13:
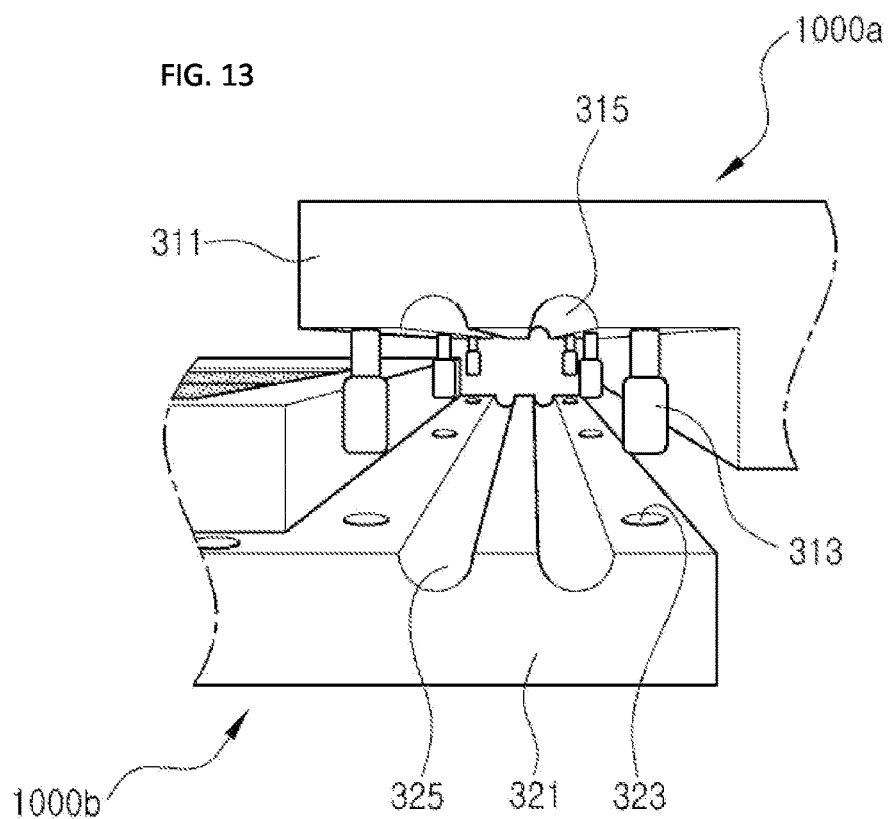
FIG. 13 is a pictorial drawing showing a combination of 'A' region in FIG. 12 in a view from a backside.

FIG. 13 is a pictorial drawing showing a combination of 'A' region in FIG. 12 in a view from a backside. In detail, FIG. 13 shows combination between the first lower plate protruding portion 321 of the second photovoltaic module 1000b and the first upper plate protruding portion 311 of the first photovoltaic module 1000a.

In detail, the plurality of first combination holes 323 is formed in two lines on the upper surface of the first lower plate protruding portion 321 of the second photovoltaic module 1000b, and the plurality of first combination protrusions 313 is formed at corresponding position on the lower surface of the first upper plate protruding portion 311 of the first photovoltaic module 1000a.

In this arrangement, after disposing the second photovoltaic module 1000b down and the first photovoltaic module 1000a up to align the first combination hole 323 and the first combination protrusion 313, the first photovoltaic module 1000a is moved downward to insert the second photovoltaic module 1000b, so that the first photovoltaic module 1000a and the second photovoltaic module 1000b are combined.

Figure 14:
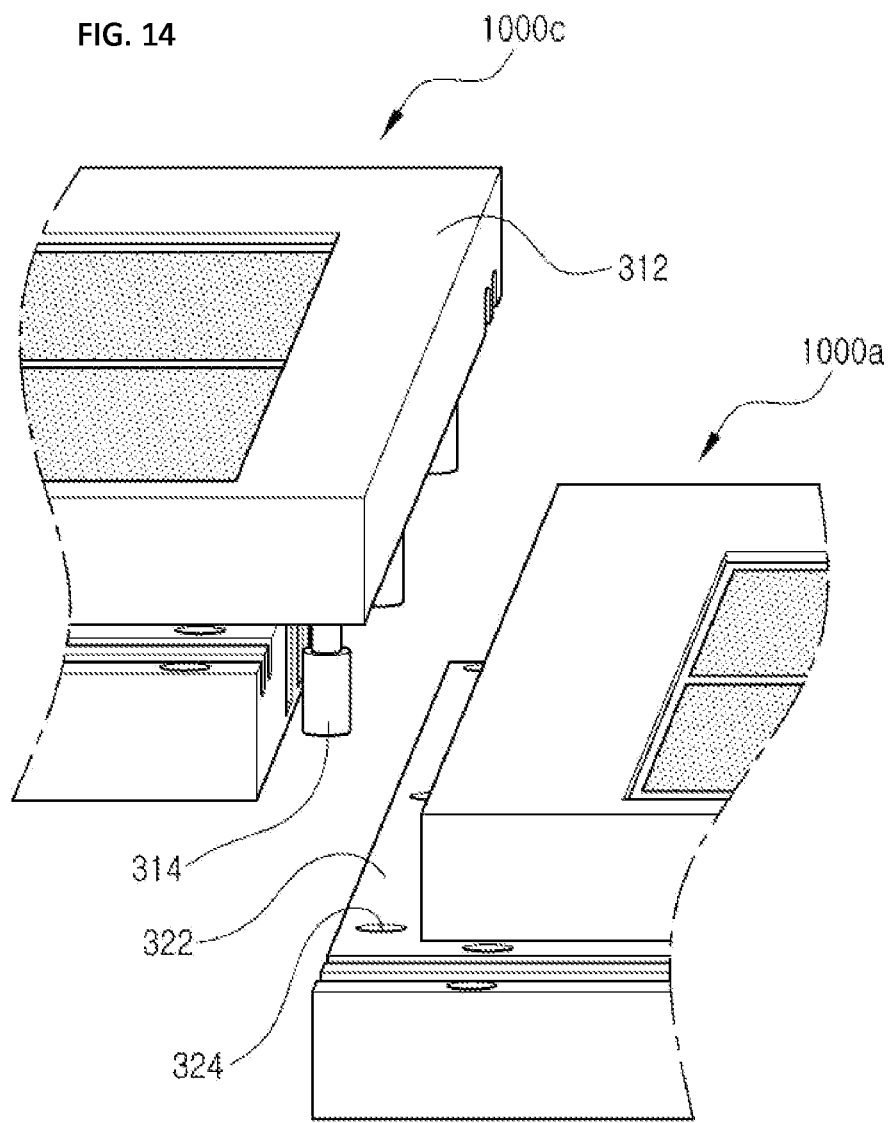
FIG. 14 is a pictorial drawing showing a combination of 'B' region in FIG. 12.

FIG. 14 is a pictorial drawing showing a combination of 'B' region in FIG. 12. In detail, FIG. 14 shows combination between the second lower plate protruding portion 322 of the first photovoltaic module 1000a and the second upper plate protruding portion 312 of the third photovoltaic module 1000c.

In detail, the second combination holes 324 is formed on the upper surface of the second lower plate protruding portion 322 of the first photovoltaic module 1000a, and the plurality of second combination protrusions 314 is formed at corresponding position on the lower surface of the second upper plate protruding portion 312 of the third photovoltaic module 1000c.

In this arrangement, after disposing the first photovoltaic module 1000a down and the third photovoltaic module 1000c up to align the second combination hole 324 and the second combination protrusion 314, the third photovoltaic module 1000c is moved downward to insert the first photovoltaic module 1000a, so that the first photovoltaic module 1000a and the third photovoltaic module 1000c are combined.

As described above, the photovoltaic module 1000 with a shingle shape may be integrally formed with a roof without an additional structure, so that installation thereof is easy, an installation angle can be easily changed even when the plurality of photovoltaic modules 1000 is combined, and a shadow effect can be minimized through each of the photovoltaic modules 1000.

Further, according to the photovoltaic module 1000 with a shingle shape, the heat generated by the solar battery module 100 can be easily dissipated out to improve the efficiency of the solar battery module 100, and the heat generated by the photovoltaic module 1000 may be collected to provide a building with the heat. That is, by using the collected heats as a heat source for heating, while preventing efficiency of the sunlight module 1000 from being lowered, the amount of energy generation per unit area increases to improve efficiency of using solar energy, comparing conventional system using a photovoltaic module and a solar heat collector.

Further, according to the photovoltaic module 1000 with a shingle shape, the plurality of photovoltaic modules 1000 can be easily combined with each other, the shape of combination can be adjusted as desired, and the wiring can be easy even when the plurality of photovoltaic modules 1000 is combined with each other.

Hereinafter, the operation of the generating efficiency optimization device 200 installed at each of the photovoltaic module 1000 will be explained in detail.

Figure 15:
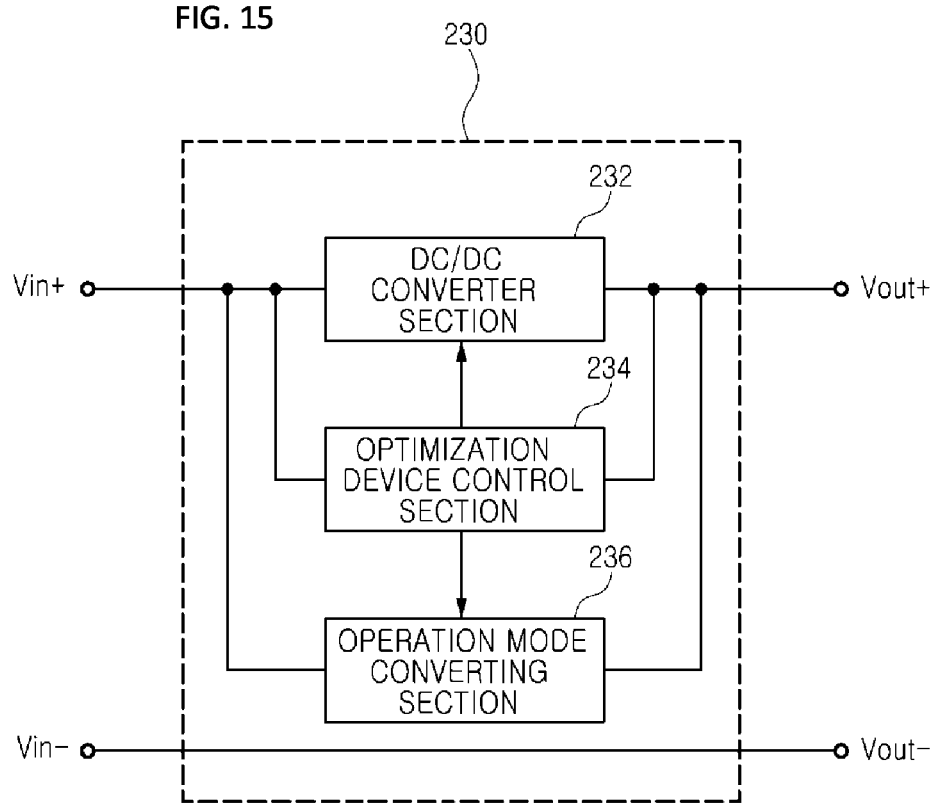
FIG. 15 is a block diagram showing a circuit section of the generating efficiency optimization device in FIG. 10.
Figure 16:
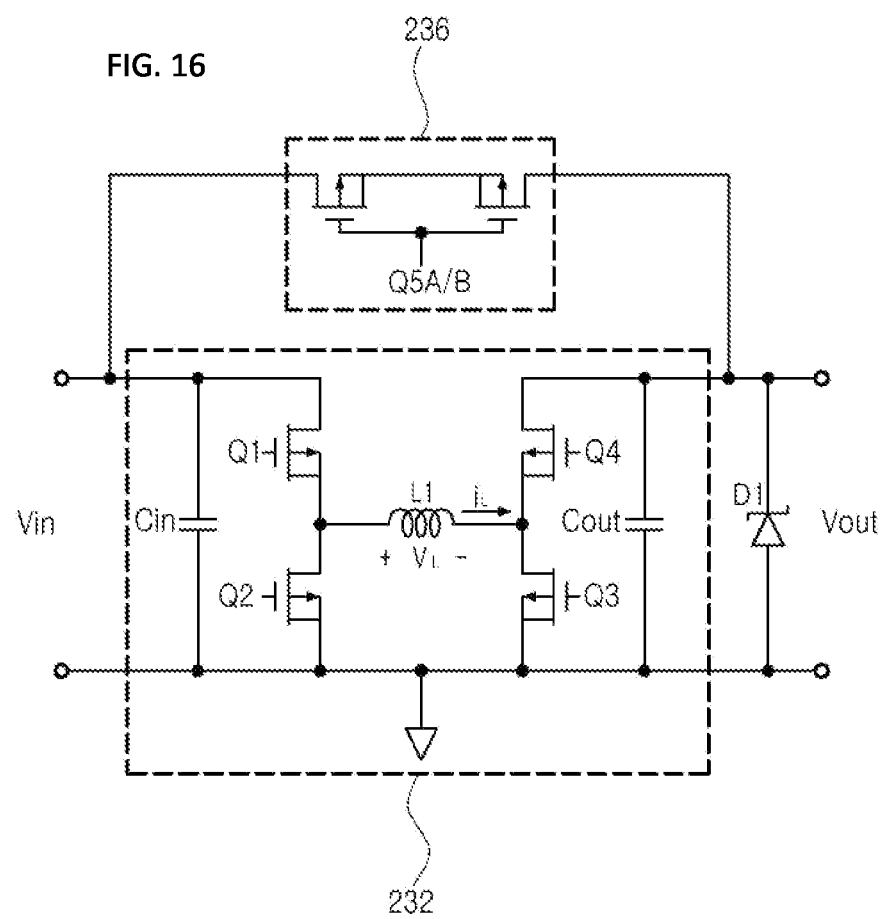
FIG. 16 is a circuit diagram showing the DC/DC converter section and the operation mode converting section in FIG. 15.

FIG. 15 is a block diagram showing a circuit section of the generating efficiency optimization device in FIG. 10, and FIG. 16 is a circuit diagram showing the DC/DC converter section and the operation mode converting section in FIG. 15.

Referring to FIGS. 15 and 16, the circuit section 230 of the generating efficiency optimization device 200 includes a DC/DC converter section 232, a optimization device control section 234 and an operation mode converting section 236.

The DC/DC converter section 232 is formed to convert electric power for the solar battery module 100. That is, the DC/DC converter section 232 converts electric power outputted by the solar battery module 100 to a voltage or an electric current proper to driving a load (for example, the inverter 2000) according to a control of the optimization device control section 234. For example, the DC/DC converter section 232 may raise voltage outputted by the solar battery module 100, perform a buck operation lowering voltage, or perform boost operation.

The optimization device control section 234 controls the DC/DC converter section 232 to trace a maximum power point (MPP) of the solar battery module 100. In order for that, optimization device control section 234 has a characteristic of detecting voltage and current outputted by the solar battery module 100.

The optimization device control section 234 may include a central processing unit (CPU), a memory unit, an input/output unit, an interface for being connected to the DC/DC converter section 232, and at least one sensor sensing voltage and current at the input terminal and the output terminal of the DC/DC converter section 232.

The optimization device control section 234 compares and analyses an input voltage and an input current, and an output voltage and an output current of the DC/DC converter section 232 to output the maximum power point (MPP) of the solar battery module 100 and to change duty cycle of the DC/DC converter section 232. Therefore, the optimization device control section 234 changes the duty cycle of the DC/DC converter section 232 to control operation in order to extract maximum electric power from the solar battery module 100.

Further, the optimization device control section 234 controls the operation mode of the generating efficiency optimization device 200 in order that the DC/DC converter section 232 traces the maximum power point (MPP) of the solar battery module 100 based on real time evaluation regarding to operation state of the solar battery module 100.

In order for that, the circuit section 230 of the generating efficiency optimization device 200 further includes an operation mode converting section 236 for changing the operation mode of the generating efficiency optimization device 200 according to the control of the optimization device control section 234. The operation mode converting section 236 is electrically connected with the DC/DC converter section 232 in parallel. For example, as shown in FIG. 16, the operation mode converting section 236 may include an electronic switch with two MOSFETs Q5A and Q5B of common gate and common source structure.

When the solar battery module 100 is judged to maintain optimum operation state which is previously set as a result of operation evaluation of the solar battery module 100, the optimization device control section 234 operates the generating efficiency optimization device 200 in a solar battery mode. That is, when a maximum power point voltage (Vmpp) of the solar battery module 100 is substantially equal to the out voltage Vout of the DC/DC converter section 232, the optimization device control section 234 operates the generating efficiency optimization device 200 in a solar battery mode. For example, the optimization device control section 234 operates the generating efficiency optimization device 200 in a solar battery mode, when the maximum power point voltage (Vmpp) of the solar battery module 100 is judged to be in ±2% range of the output voltage Vout as a result of operation evaluation of the solar battery module 100. On the other hand, the voltage range for determining optimum operation state may be adjusted according to setting of a user.

The optimization device control section 234 maintains the operation mode converting section 236 in a turn on state, and shutdowns the DC/DC converter section 232 for operation of the solar battery mode. Therefore, in the solar battery mode, the power outputted by the solar battery module 100 is directly outputted through the operation mode converting section 236 without passing through the DC/DC converter section 232. As a result, an additional processing of electric power treating such as a control of operation of the DC/DC converter section 232 is omitted in the solar battery mode, so that optimum electric power without power loss may be obtained.

Additionally, when an overcurrent flows through the DC/DC converter section 232, the DC/DC converter section 232 is overheated or the DC/DC converter section 232 is damaged, the optimization device control section 234 changes the generating efficiency optimization device 200 to be in the solar battery mode to protect the generating efficiency optimization device 200.

On the other hand, when the solar battery module 100 is judged to be out of the optimum operation state which is previous set as a result of operation evaluation of the solar battery module 100, the optimization device control section 234 turns off the operation mode converting section 236, and controls the DC/DC converter section 232 for tracing a maximum power point (MPP). That is, when the maximum power point voltage (Vmpp) of the solar battery module 100 is higher or lower than the out voltage Vout of the DC/DC converter section 232, the optimization device control section 234 controls the DC/DC converter section 232 to output optimum power generation.

In the present embodiment, the DC/DC converter section 232 is formed by a buck-boost converter capable of operating in a buck mode and in a boost mode.

For example, the DC/DC converter 232 includes four FETs Q1, Q2, Q3 and Q4 with a H-bridge structure.

The optimization device control section 234 determines the optimum mode, in which the DC/DC converter section 232 operates, to trace the maximum power point (MPP) of the solar battery module 100, based on the real time evaluation regarding to the operation state of the solar battery module 100.

For an example, when the when the maximum power point voltage (Vmpp) of the solar battery module 100 is lower than the output voltage Vout of the DC/DC converter section 232 as a result of operation evaluation of the solar battery module 100, the optimization device control section 234 operates the DC/DC converter section 232 in the buck mode. For example, the optimization device control section 232 operates the DC/DC converter section 232 in the buck mode, when the maximum power point voltage (Vmpp) of the solar battery module 100 is lower than about 98% of the output voltage Vout of the DC/DC converter section 232. In the buck mode, the first FET Q1 and the second FET Q2 are switched, the third FET Q3 is in an off-state, and the fourth FET Q4 is in an on-state.

For another example, when the when the maximum power point voltage (Vmpp) of the solar battery module 100 is higher than the output voltage Vout of the DC/DC converter section 232 as a result of operation evaluation of the solar battery module 100, the optimization device control section 234 operates the DC/DC converter section 232 in the boost mode. For example, the optimization device control section 234 operates the DC/DC converter section 232 in the boost mode, when the maximum power point voltage (Vmpp) of the solar battery module 100 is higher than about 102% of the output voltage Vout of the DC/DC converter section 232. In the boost mode, the third FET Q3 and the fourth FET Q4 are switched, the second FET Q2 is in an off-state, and the first FET Q1 is in an on-state.

As described above, when the solar battery module 100 is determined to be out of the optimum operation state, the DC/DC converter section 232 is controlled to trance the maximum power point (MPP) of the solar battery module 100 to maintain the solar battery module 100 in the optimum operation state so that generation efficiency can be optimized.

On the other hand, the generation efficiency optimization device 200 may further include a bypass diode D1 for bypassing string current. The bypass diode D1 bypasses the string current to prevent string current loss, so that the string current does not pass through the DC/DC converter section 232 and the solar battery module 100, when a power loss is induced due to a shadow of the solar battery module 100, or the solar battery module 100 or the DC/DC converter section 232 is damaged. In order for that, the bypass diode D1 is in a reverse bias state in a normal operation state, and in a forward bias state in order to bypass the string current in an abnormal operation state.

As described above, the generating efficiency optimization device 200 capable of separately controlling each of the solar battery module 100 is installed at each solar battery module 100, so that the operation mode of the solar battery module 100 is maintained in best to improve and to optimize total efficiency of the photovoltaic system.

Figure 17:
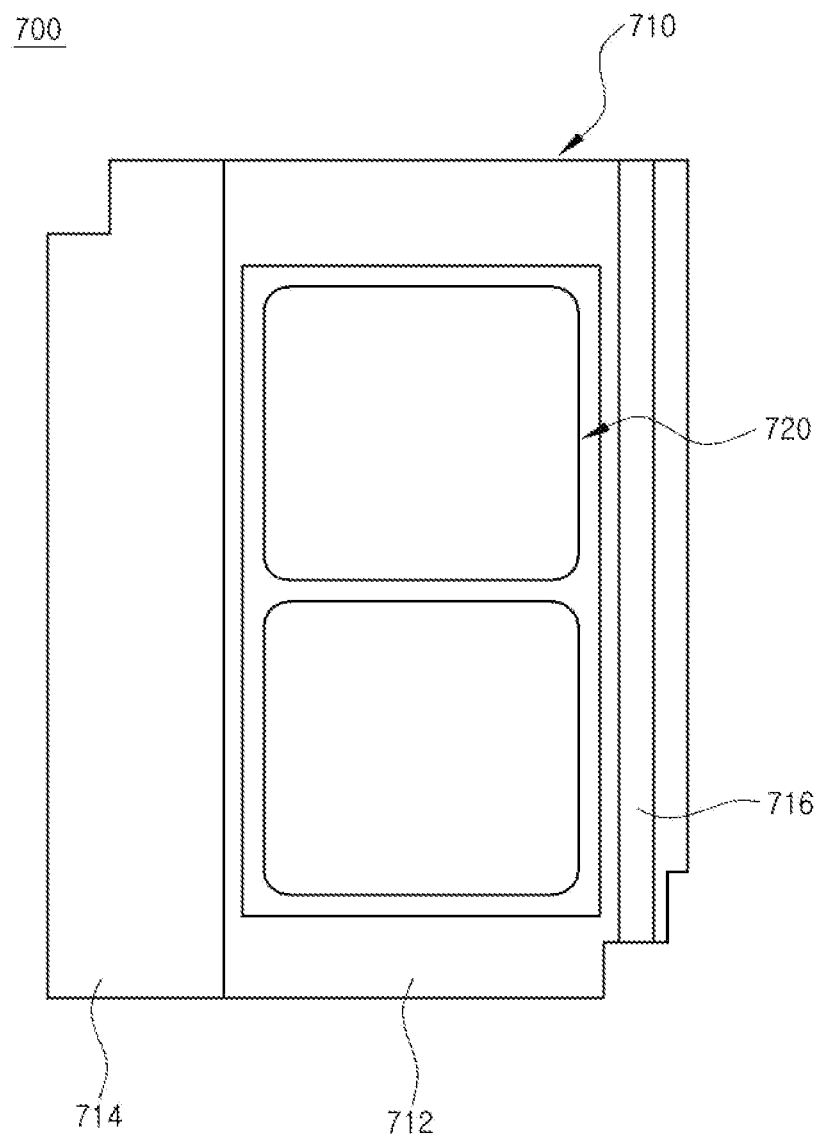
FIG. 17 is a plan view showing a photovoltaic module according to another embodiment of the present invention.
Figure 18:
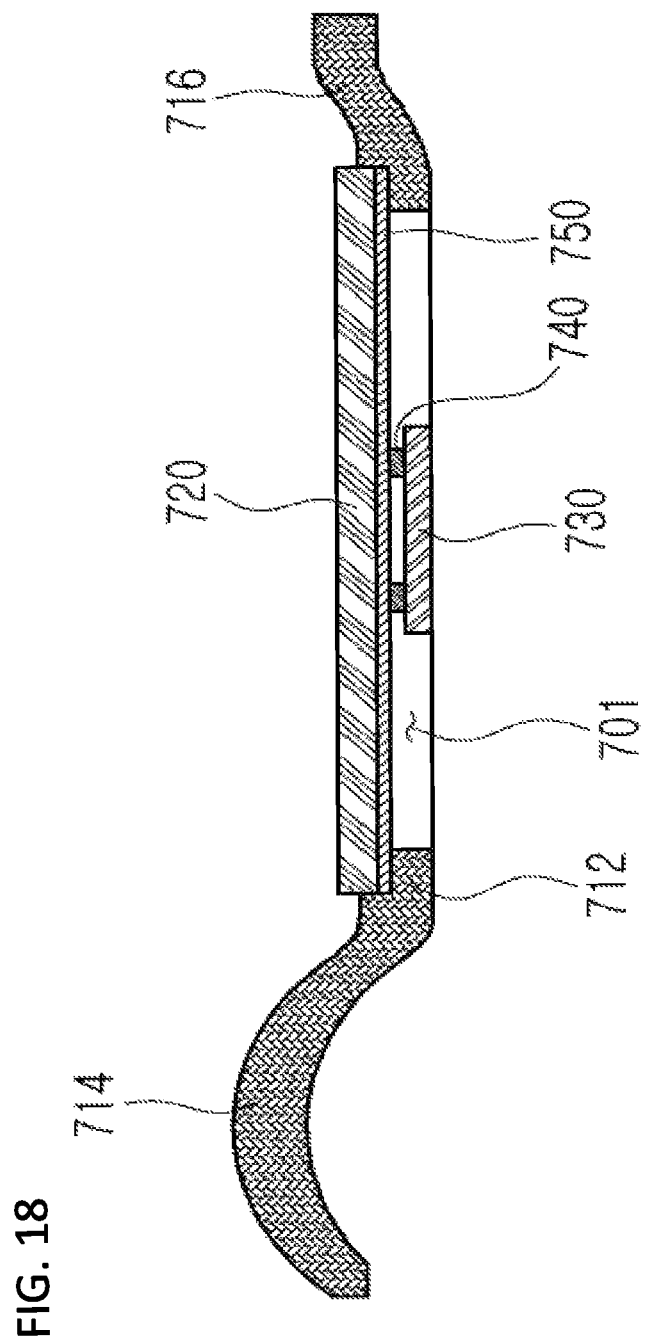
FIG. 18 is a cross-sectional view showing the photovoltaic module in FIG. 17.
Figure 19:
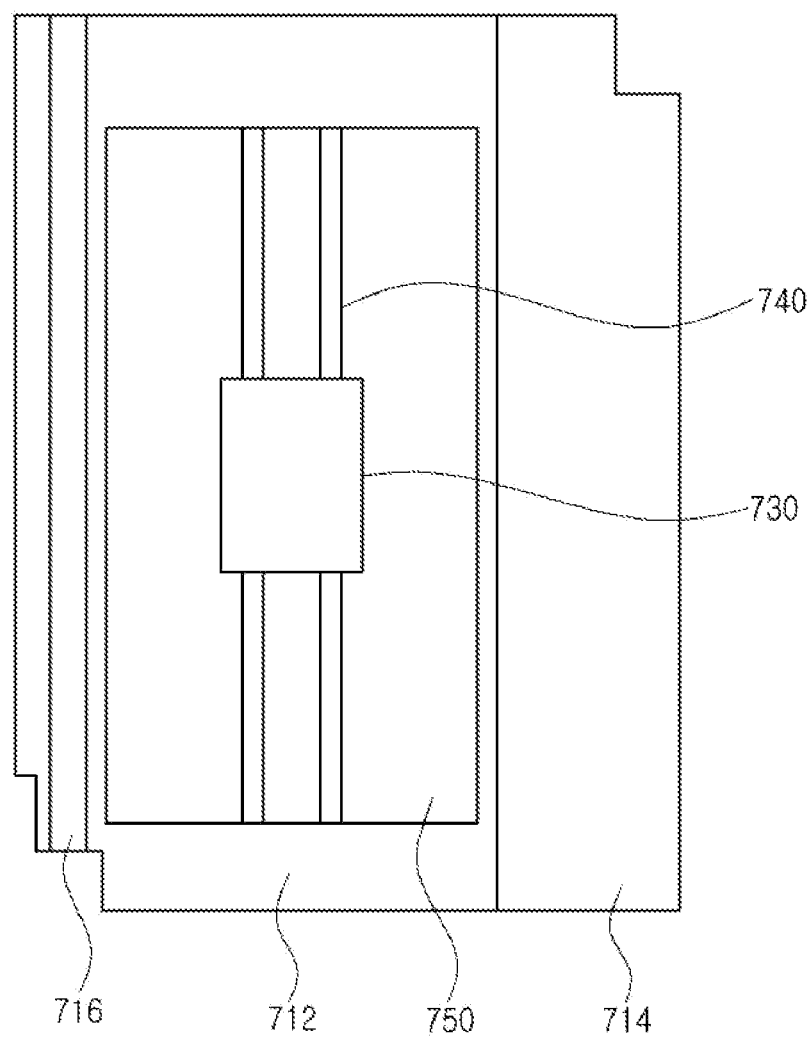
FIG. 19 is a rear view showing the photovoltaic module in FIG. 17.

FIG. 17 is a plan view showing a photovoltaic module according to another embodiment of the present invention, FIG. 18 is a cross-sectional view showing the photovoltaic module in FIG. 17, and FIG. 19 is a rear view showing the photovoltaic module in FIG. 17.

Referring to FIG. 17, FIG. 18 and FIG. 19, a photovoltaic module 700 according to another embodiment of the present invention includes a frame 710 having a roof tile shape and a penetration part 701 formed at a center region thereof, a solar battery module 720 disposed on the frame 710 such that the solar battery module 720 covers the penetration part 701, and a generating efficiency optimization device 730 installed in the penetration part 701 and connected to an output terminal of the solar battery module 720 to optimize photovoltaic efficiency.

The frame 710 has a same shape as a roof tile to replace a roof tile of a house. For example, the frame 710 has a flat portion 712 that is flat in order that the solar battery module 720 is mounted, a first curved portion 714 curvedly extending from a side of the flat portion 714 in a first direction, and a second curved portion 716 curvedly extending from an opposite side of the flat portion 714 in a second direction opposite to the first direction. The first curved portion 714 and the second curved portion 716 are curvedly formed in opposite directions, so that neighboring photovoltaic modules 700 can be connected.

The photovoltaic module 700 may further include a heat dissipation plate 750 disposed on a back surface of the solar battery module 720. The heat dissipation plate 750 dissipates heats generated by the solar battery module 720 when generating power in order to improve generation efficiency of the solar battery module 720. The heat dissipation plate 750 may be formed in a mesh type by aluminum alloy having high conductivity as shown in FIG. 2. Alternatively, the heat dissipation plate 750 may be formed such that the heat dissipation plate 750 includes an low melting point metal inner plate part and an aluminum outer plate part covering the low melting point metal inner plate part as shown in FIG. 8 and FIG. 9.

Additionally, the photovoltaic module 700 may further include an installation rail 740 crossing the penetration part 701 for installing the generating efficiency optimization device 730. The installation rail 740 is formed under the solar battery module 720 and the heat dissipation plate 750, and exposed out through the penetration part 701 for installing the generating efficiency optimization device 730. For example, the installation rail 740 may be combined with the frame 710 such that the installation rail 740 is disposed inside of the penetration part 701. The installation rail 740 is formed to be space-saving in order to improve heat dissipation efficiency of the heat dissipation plate 750. In order for that, the installation rail 740 is formed in a parallel rail shape with a thin width.

The generating efficiency optimization device 730 is combined with the installation rail 740 to be installed in the penetration part 701 of the frame 710. The generating efficiency optimization device 730 may be installed per photovoltaic module 700, or per a group including a plurality of photovoltaic module 700.

As describe above, the generating efficiency optimization device 730 for optimizing generation efficiency of the photovoltaic module 700 is installed inside of the penetration part 701 of the frame 710, so that the photovoltaic module 700 can be compactified without increasing thickness. And, the photovoltaic module 700 with a roof tile shape can be integrally installed at a roof without an additional structure to make installation easy. Further, the photovoltaic module 700 with a roof tile shape dissipates heats generated by the solar battery module 100 to improve efficiency of the solar battery module 100.

The detailed description of the present invention is described with regard to the preferable embodiment of the present invention, however, a person skilled in the art may amend or modify the present invention within the spirit or scope in the following claim of the present invention.

The invention claimed is:

1. A photovoltaic module comprising:
a solar battery module generating electric power by using sunlight;
an external frame having a receiving part receiving the solar battery module;
a support frame disposed in the receiving part to support the solar battery module, the support frame having a penetration part formed at a center region; and
a generating efficiency optimization device installed in the penetration part and connected to an output terminal of the solar battery module to optimize efficiency of photovoltaics,
wherein the generating efficiency optimization device comprises:
a DC/DC converter section converting a level of direct current power outputted by the solar battery module;
an optimization device control section controlling an operation mode of the generating efficiency optimization device; and
an operation mode converting section electrically connected with the DC/DC converter section in parallel in order to convert the operation mode of the generating efficiency optimization device according to a control of the optimization device control section,
wherein the optimization device control section controls the operation mode converting section to switch the operation mode between a solar battery mode such that electric power outputted from the solar battery module is directly outputted through the operation mode converting section without passing through the DC/DC converter section and a buck mode such that the DC/DC converter section is operated to lower voltage outputted by the solar battery module, and
wherein the operation mode converting section comprises an electronic switch with two MOSFETs of common gate and common source structure.

2. The photovoltaic module of claim 1, further comprising an installation rail formed to cross the penetration part for installing the generating efficiency optimization device.

3. The module of claim 2, wherein the generating efficiency optimization device comprises:
a case combined with the installation rail to be fastened;
an input terminal section formed at a side face of the case, such that an output wire of the solar battery module is connected thereto;
a circuit section installed inside of the case to optimize the efficiency of photovoltaics with regard to an input through the input terminal section; and
an output section formed at a side face of the case to transmit an output of the circuit section.

4. The photovoltaic module of claim 3, wherein the generating efficiency optimization device further comprises an indication lamp indicating an normal operation state or abnormal operation state of the generating efficiency optimization device.

5. The photovoltaic module of claim 1, wherein the optimization device control section operates the generating efficiency optimization device in the solar battery mode when the solar battery module is judged to maintain an optimum operation state that is previously set.

6. The photovoltaic of claim 5, wherein the optimization device control section maintains the operation mode converting section in an on-state, and shuts down the DC/DC converter section for the solar battery mode.

7. The photovoltaic module of claim 1, wherein the optimization device control section controls the DC/DC converter section such that the optimization device control section maintains the operation mode converting section in an off-state to trace maximum power point, when the solar battery module is judged to be out of an optimum operation state that is previously set.

8. The photovoltaic module of claim 7, wherein the optimization device control section operates the DC/DC converter section in the buck mode when a maximum power point voltage of the solar battery module is lower than an output voltage.

9. The photovoltaic module of claim 7, wherein the optimization device control section operates the DC/DC converter section in a boost mode when a maximum power point voltage of the solar battery module is higher than an output voltage.

10. The photovoltaic module of claim 1, wherein the optimization device control section further comprises a bypass diode for bypassing a string current, when the solar battery module is defective.

11. The photovoltaic module of claim 1, wherein the external frame comprises an upper plate and a lower plate, the lower plate includes a first lower plate protruding portion protruding out of the upper plate in a width direction and a second lower plate protruding portion protruding out of the upper plate in a length direction that is perpendicular to the width direction, and the upper plate includes a first upper plate protruding portion protruding out of the lower plate in the width direction to be opposite to the first lower plate protruding portion, and a second upper plate protruding portion protruding out of the lower plate in the length direction to be opposite to the second lower plate protruding portion.

12. The photovoltaic module of claim 11, wherein a wiring groove for drawing a wiring out is formed on an upper surface of the first lower plate protruding portion and a lower surface of the first upper plate protruding portion.

13. The photovoltaic module of claim 11, wherein a combination hole is formed on an upper surface of the first lower plate protruding portion and the second lower plate protruding portion, and a combination protrusion corresponding the combination hole is formed on a lower surface of the first upper plate protruding portion and the second upper plate protruding portion.

14. The photovoltaic module of claim 11, wherein the lower plate comprises a first ventilation hole penetrating in the length direction of the external frame, and the support frame comprises a second ventilation hole penetrating in the length direction of the external frame to be connected to the first ventilation hole.

15. The photovoltaic module of claim 1, further comprising a heat dissipation plate disposed between the solar battery module and the support frame.

16. The photovoltaic module of claim 15, wherein the heat dissipation plate has a mesh shape.

* * * * *